(12) United States Patent
Han et al.

(10) Patent No.: US 6,372,649 B1
(45) Date of Patent: Apr. 16, 2002

(54) METHOD FOR FORMING MULTI-LEVEL METAL INTERCONNECTION

(75) Inventors: Min Sub Han, Seoul; Tae Gook Lee, Kyoungki-do; Wan Soo Kim, Seoul; Byoung Ju Kang, Kyoungki-do, all of (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 48 days.

(21) Appl. No.: 09/599,172

(22) Filed: Jun. 22, 2000

(30) Foreign Application Priority Data

Jun. 24, 1999 (KR) .............................. 99-24046

(51) Int. Cl.$^7$ .............................................. H01L 21/00
(52) U.S. Cl. ...................... 438/692; 216/18; 216/75; 216/79; 438/723; 438/743; 438/745
(58) Field of Search ........................ 38/626, 631, 633, 38/637, 645, 672, 692, 697, 720, 723, 742, 743, 745; 216/18, 67, 75, 79

(56) References Cited

U.S. PATENT DOCUMENTS

| | | | |
|---|---|---|---|
| 4,840,923 A | * | 6/1989 | Flagello et al. ............... 216/18 |
| 5,077,226 A | | 12/1991 | Youn et al. |
| 5,504,038 A | | 4/1996 | Chien et al. |
| 5,525,833 A | | 6/1996 | Jang |
| 5,691,240 A | | 11/1997 | Yang |
| 5,712,195 A | | 1/1998 | Chang |
| 5,758,413 A | * | 6/1998 | Chong et al. ............. 216/18 X |
| 5,893,741 A | | 4/1999 | Huang |
| 6,001,685 A | | 12/1999 | Kim |

FOREIGN PATENT DOCUMENTS

| | | |
|---|---|---|
| JP | 04063461 | 2/1992 |
| JP | 10303294 | 11/1998 |
| JP | 11008299 | 1/1999 |

* cited by examiner

*Primary Examiner*—William A. Powell
(74) *Attorney, Agent, or Firm*—Pillsbury Winthrop LLP

(57) ABSTRACT

A method for forming a multi-level metal interconnection, comprising the step of forming a first metal interconnection over an underlying layer; forming an insulating layer having a selected thickness over the underlying layer including the first metal interconnection; etching the insulating layer to form a contact hole, thereby exposing the first metal interconnection; forming a metal plug in the contact hole to contact with the first metal interconnection; etching the insulating layer by a portion of the selected thickness; forming a pair of metal spacers in sidewalls of the metal plug over the insulating layer; and forming a second metal interconnection over the insulating layer to contact with the first metal interconnection through one of the metal spacers.

13 Claims, 11 Drawing Sheets

METHOD FOR FORMING MULTI-LEVEL METAL INTERCONNECTION

BACKGROUND OF THE INVENTION

1. Field of the Invention

This invention relates to a method for fabricating a semiconductor device, and more particularly to a method for forming a multi-level interconnection in a semiconductor device.

2. Description of the Related Art

When a fine pattern is formed as high integration of semiconductor devices, assurance of overlap margin due to reduction of linewidth is demanded. FIG. 1A to FIG. 1F show sectional views illustrating a method for forming a multi-level metal interconnection. Referring to FIG. 1A, an insulating layer 13 is formed over an underlying layer 191 including a first metal interconnection 12 such as a substrate or as an insulating layer. The insulating layer 13 is etched to form contact hole 13' where a contact plug is to be formed, thereby exposing the first metal interconnection 12. Referring to FIG. 1B, a metal film for metal plug 14 is deposited so as to be filled in the contact hole 13' and the metal film 14 is etched with a chemical mechanical polishing (CMP) method to form a metal plug 14' as shown in FIG. 1C.

As shown in FIG. 1D, a metal film for second metal interconnection 15 having high conductivity such as Al is deposited over the underlying layer 11 and as shown in FIG. 1E, a photosensitive film 16 is coated on the metal film for second metal interconnection 15 and then patterned. As shown in FIG. 1F, using the patterned photosensitive film 16 as a mask, the metal film 15 is etched to form a second metal interconnection 17.

However, the prior method using the metal plug has a draw back as follows. After etching the metal film for second metal interconnection, a tip is formed in the metal stringer within the contact hole, thereby degrading the device property and acting as the defect factor to reduce yield. Furthermore, the pattern overlap margin between the second metal interconnection formed over the insulating layer and the first metal interconnection formed below the insulating layer is reduced and the production yield and property are degraded with reduction of process margin, as the pattern size is diminished more and more.

FIG. 2A to FIG. 2D show sectional views illustrating a method for forming a multi-level metal interconnection. A first metal interconnection 22 is formed on an underlying layer 21 such as a substrate or an insulating layer as shown in FIG. 2A and an insulation process for metal interconnection is carried out as shown in FIG. 2B. That is, a first insulating layer 23 having good step coverage and insulation properties is formed the underlying layer 21 including the first metal interconnection 22. A second insulating layer 24 for planarization is formed on the first insulating layer 23 and finally a third insulating layer 25 is formed on the second insulating layer 24.

As shown in FIG. 2C, a photosensitive film 26 is formed on the third insulating layer 25. As shown in FIG. 2D, the first to third insulating layers 23–25 are etched using the photoresist film 26 as a mask to form a contact hole, thereby exposing the first metal interconnection 22. A second metal interconnection 27 is formed on the third insulating layer 25 to contact with the first metal interconnection 22 through the contact hole.

The prior method has drawbacks as follows. As high integration of semiconductor memory devices, a line and a space of the metal interconnection are smaller so that a void is generated in forming the insulation layer for metal interconnection as shown in FIG. 3A. The void brings about lifting phenomenon of the insulating layer in the following heat treatment so that the critical damage of the device is occurred.

Besides, if misalignment is occurred in the photoetching process for forming the contact hole, when the second metal interconnection is formed following the contact hole formation process using the photosensitive, the overlap margin becomes smaller as shown in FIG. 3B. Accordingly, the electrical property of the device is degraded and mass production is very difficult with lack of the photoetching process margin.

SUMMARY OF THE INVENTION

It is an object of the present invention to provide a method for forming a multi-level metal interconnection of a semiconductor device with a metal plug, capable of improving the overlap margin between patterns and metal interconnection property using a metal spacer.

It is another object of the present invention to provide a method for forming a multi-level metal interconnection of a semiconductor device, capable of improving the planarization degree of the metal intermediate insulating layer, preventing occurrence of a void and assuring the sufficient process margin using a metal spacer.

According to an aspect of the present invention, there is provided to a method for forming a multi-level metal interconnection of a semiconductor device, comprising the steps of: forming a first metal interconnection on an underlying layer; forming an insulating layer over the underlying layer including the first metal interconnection; etching the insulating layer to form a contact hole, thereby exposing the first metal interconnection; forming a metal plug in the contact hole; further etching the insulating layer by a thickness; forming metal spacers in sidewalls of the metal plug over the insulating layer; and forming a second metal interconnection over the insulating layer to contact with the first metal interconnection through the metal spacer.

In the formation step of the metal plug, a tungsten plug is deposited over the insulating layer including the contact hole and then etched with a CMP process to form the metal plug. In the etching step of the insulating layer, the insulating layer is etched using an oxide target to have a height lower than the metal plug. Following the formation step of the second metal interconnection, the method of this invention further includes the step of removing the metal spacer which is not contacted with the metal plug.

There is also provided to a method for forming a multi-level metal interconnection of a semiconductor device, comprising the steps of: forming a first metal interconnection on an underlying layer; forming a first insulating layer over the underlying layer including the first metal interconnection; etching the first insulating layer to have a height lower than the first metal interconnection, thereby forming a height difference; forming metal spacers in sidewalls of the first metal interconnection over the first insulating layer; forming a planarization film over the whole surface of the underlying layer including the metal spacers; etching the planarization film to form a contact hole, thereby exposing the first metal interconnection; and forming a second metal interconnection over the planarization film to contact with the first metal interconnection through the contact hole.

The first insulating layer is etched by a wet or dry etching process. In etching the first insulating layer, a freon gas or a diluted gas of CO, O2, Ar and He is used to increase the etching selectivity to the first metal interconnection.

The planarization film formation step includes the step of forming a second insulating layer having good planarization property over the underlying layer and the step of forming a third insulating layer over the second insulating layer.

BRIEF DESCRIPTION OF THE DRAWINGS

The objects and features of the invention may be understood with reference to the following detailed description of an illustrative embodiment of the invention, taken together with the accompanying drawings in which.

DETAILED DESCRIPTION OF THE INVENTION

Figure 1A:
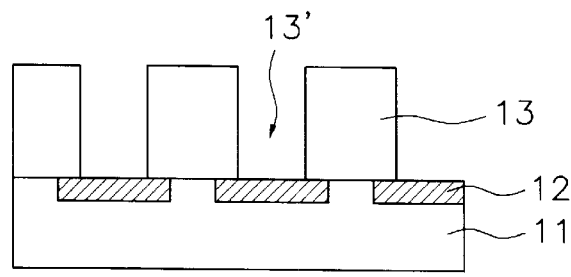
FIG. 1A to FIG. 1F are sectional views illustrating a method for forming a multi-level metal interconnection in the prior art.
Figure 1B:
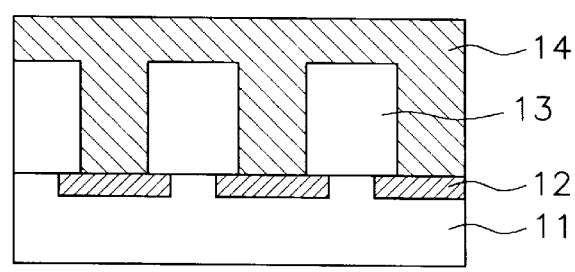
Figure 1C:
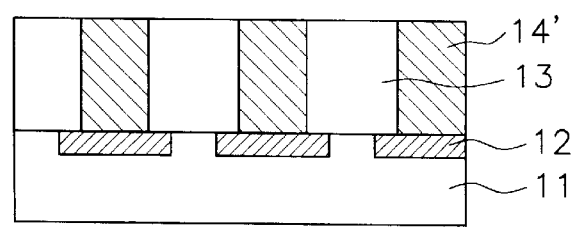
Figure 1D:
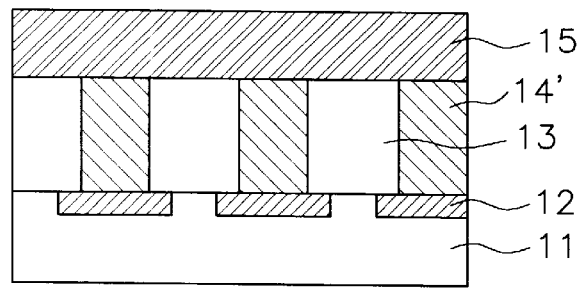
Figure 1E:
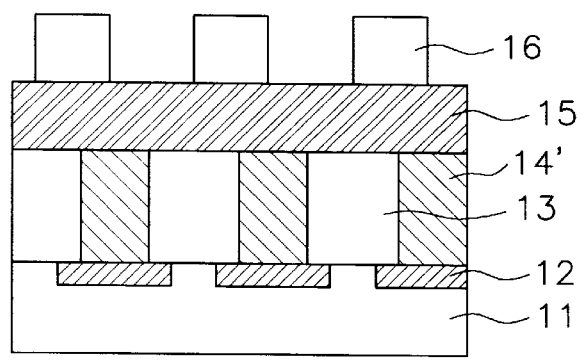
Figure 1F:
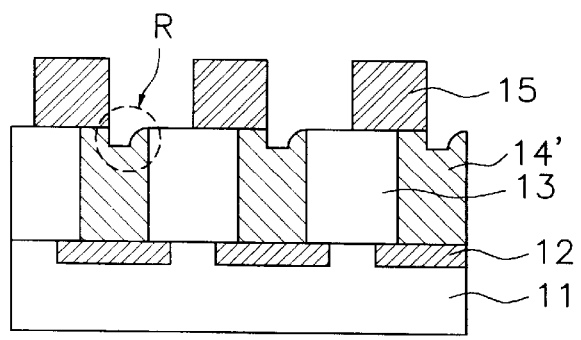
Figure 2A:
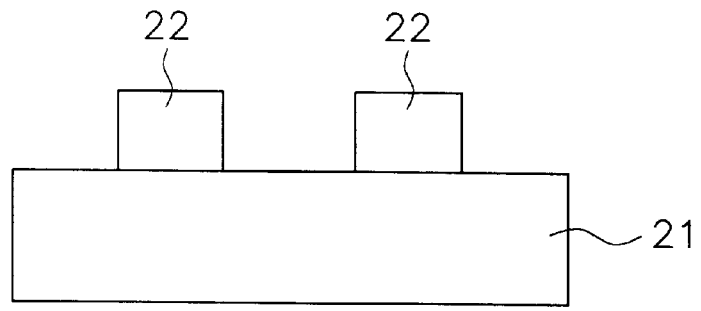
FIG. 2A to FIG. 2D are sectional views illustrating a method for forming a multi-level metal interconnection in another prior art.
Figure 2B:
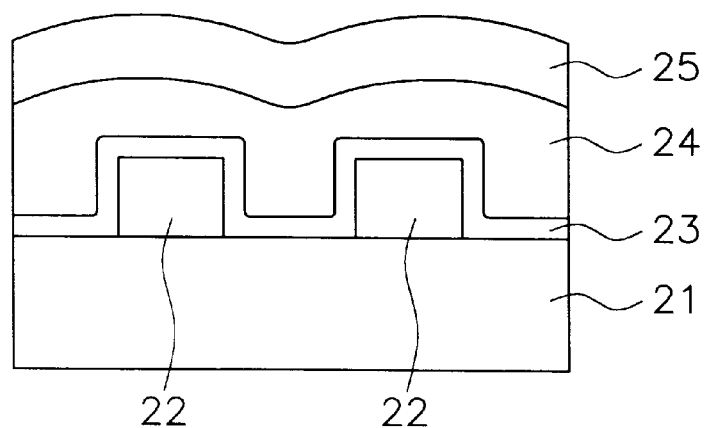
Figure 2C:
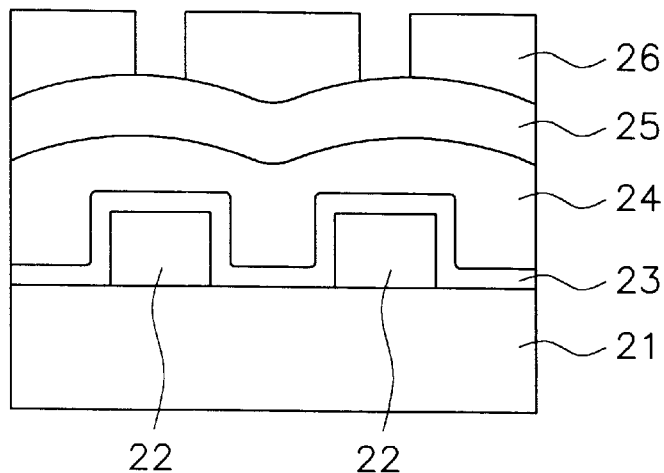
Figure 2D:
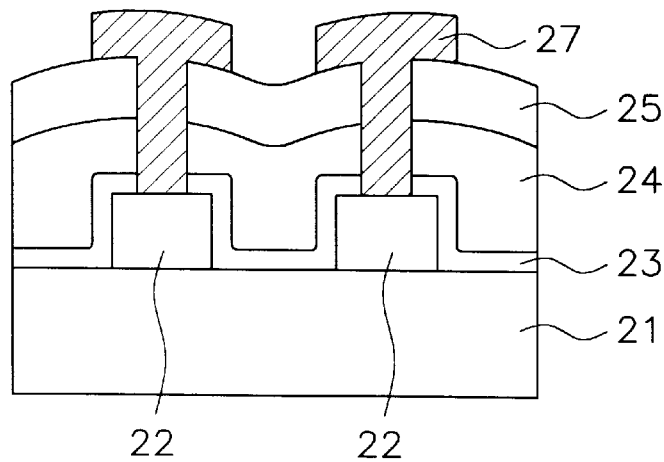
Figure 3A:
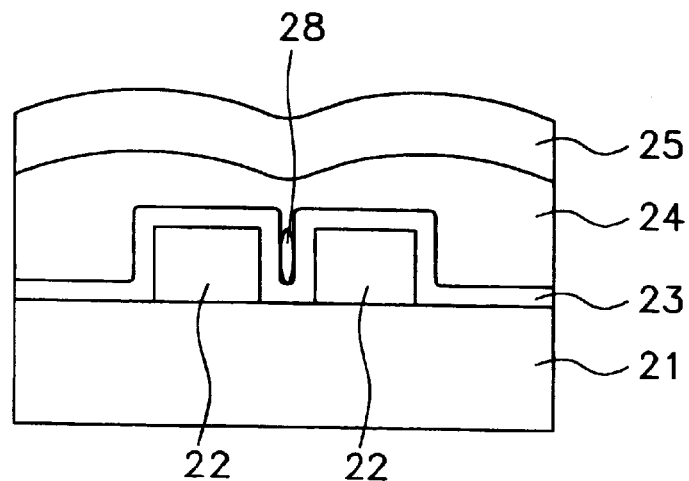
FIG. 3A and FIG. 3B are sectional view illustrating an occurrence of a void and a misalignment in the formation of the multi-level metal interconnection in the prior art.
Figure 3B:
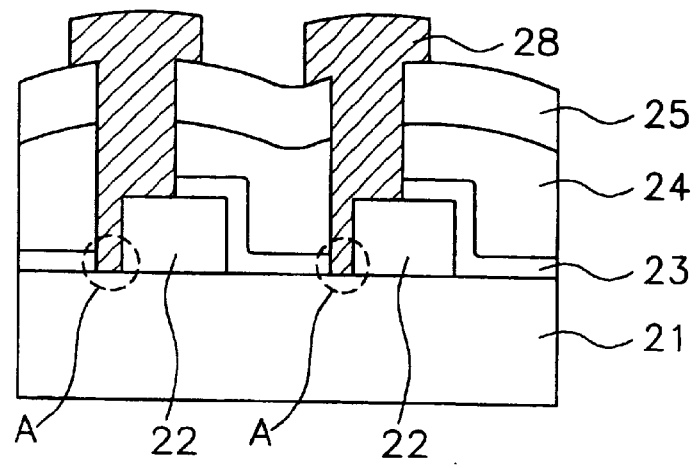
Figure 4A:
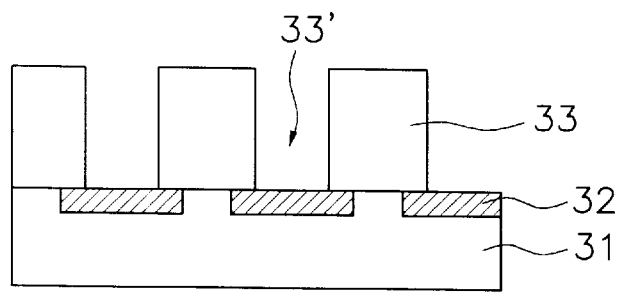
FIG. 4A to FIG. 4H are sectional views illustrating a method for forming a multi-level metal interconnection in accordance with one embodiment of this invention.

FIG. 4A to FIG. 4H shows sectional views illustrating a method for forming a multi-level metal interconnection of a semiconductor device in accordance with one embodiment of this invention. Referring to FIG. 4A, an insulating layer 33 is formed on an underlying layer 31 such as a substrate or an insulating layer which a first metal interconnection 32 is formed thereon. The insulating layer 33 is etched to form a contact hole 33' for metal plug, thereby exposing the first metal interconnection 32.

Figure 4B:
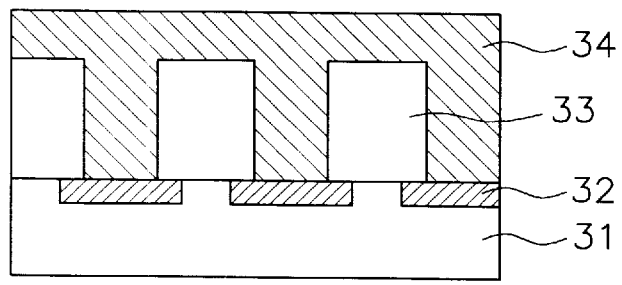
Figure 4C:
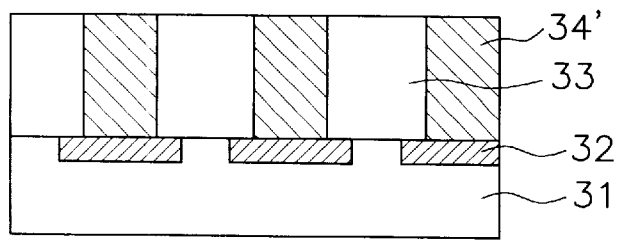
Figure 4D:
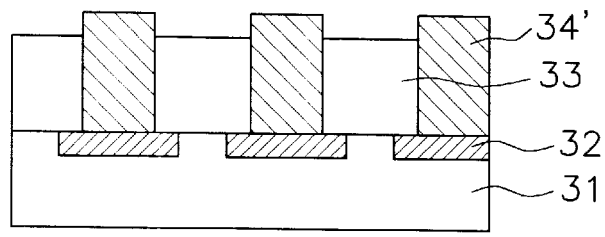

Referring to FIG. 4B, a tungsten film 34 as a metal film for plug having good step coverage property is deposited on the insulation layer 33 to be filled with the contact hole 33'. Referring to FIG. 4C, a tungsten film 34 is etched with a CMP process to form a metal plug 34'. Referring to FIG. 4D, a portion of the insulating layer 33 is etched by an oxide target etching process, i.e., a blanket etching method. The insulating layer is further etched by a selected thickness so that a height of the insulating layer 33 is lower than that of the metal plug 34'. At this time, a contact surface between the first metal interconnection 32 and a second metal interconnection which is to be formed in the following process is determined with the etched amount of the insulating layer 33, i.e. the etched thickness of the insulating layer 33.

Figure 4E:
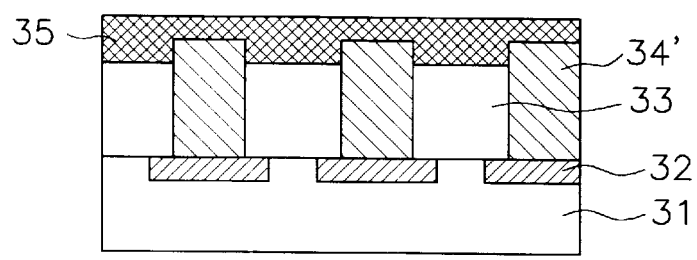
Figure 4F:
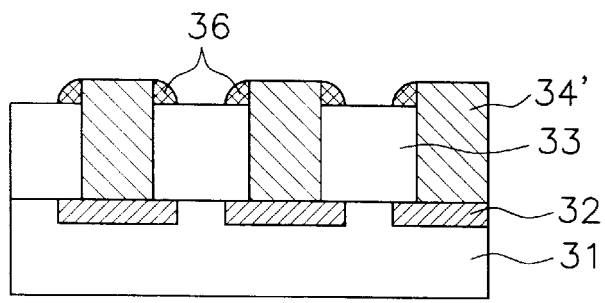

Referring to FIG. 4E, a metal film 35 is deposited over the insulating layer 33 and the metal plug 34' and then blanket-etched to form metal spacers 36 in sidewalls of the metal plug 34' over the insulating layer 33 as shown in FIG. 4F. At this time, the size of the metal spacer 36 is adjustable to a thickness of the metal film 35 to be deposited.

Figure 4G:
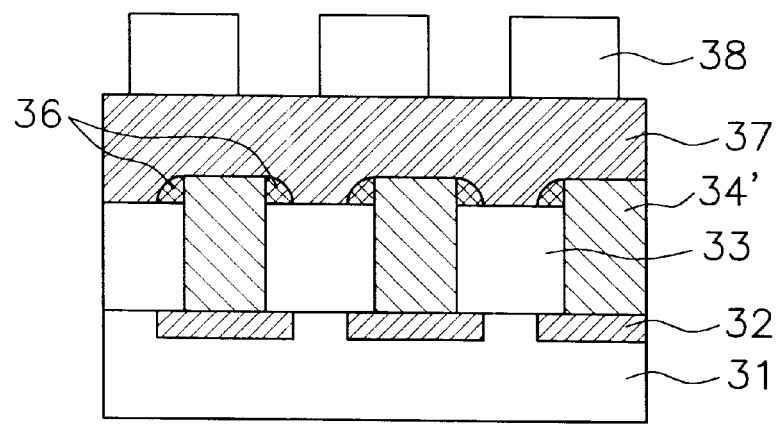
Figure 4H:
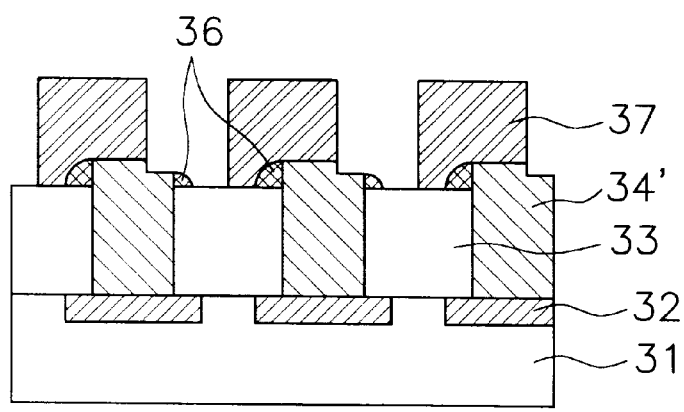

Referring to FIG. 4G, a metal film 37 having high conductivity such as Al is deposited over the insulating layer 33 including metal spacers 36 and the metal plug 34'. Referring to FIG. 4H, a photosensitive film 38 is coated on the metal film 37 and then patterned and the metal film 37 is etched using the patterned photosensitive pattern 38 as a mask to form the second metal interconnection 39. At this time, an exposed one of sidewalls which is not overlapped with the second metal interconnection 39 may be etched by controlling the etching selectivity between the metal plug 34' and the second metal interconnection 37.

According to the one embodiment of this invention mentioned above, the contact area between the metal plug 34' and the second metal interconnection 37 is increased by forming the metal spacers. The contact resistance is reduced and the overlap margin between the metal plug and the second metal interconnection can be improved. Therefore, it can solve the problem of the remaining of the metal stringer after the formation of the second metal interconnection in the prior art so that the device property can be improved.

Figure 5A:
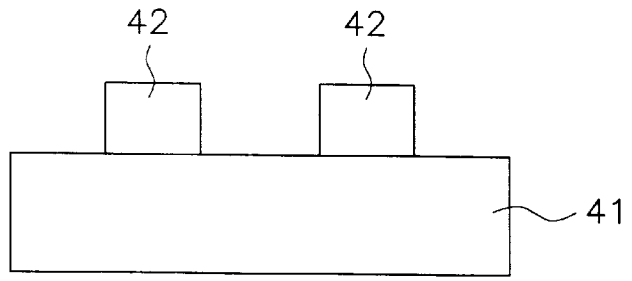
FIG. 5A to FIG. 5G are sectional views illustrating a method for forming a multi-level metal interconnection in accordance with another embodiment of this invention.
Figure 5B:
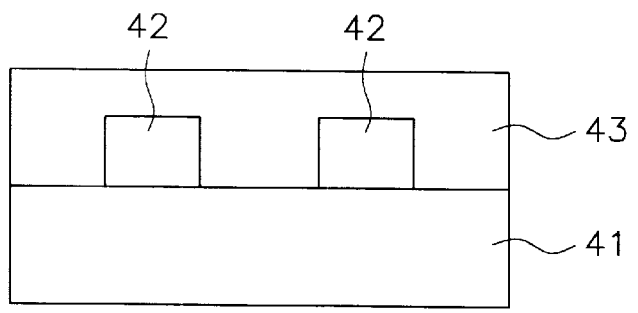

FIG. 5A to FIG. 5G show sectional views illustrating a method for forming a multi-layer metal interconnection in accordance with another embodiment of this invention. Referring to FIG. 5A, a metal film for first metal interconnection is deposited on an underlying layer 41 such as a substrate or an insulating layer and then etched to form a first metal interconnection 42. Referring to FIG. 5B, a first insulating layer 43 is formed over the underlying layer 41 including the first metal interconnection 42. In one embodiment of this invention, as the first insulating layer 43, the Si-rich oxide film which has good step coverage property and good insulating property and is a plasma enhanced chemical vapor deposition (PECVD) oxide film of 300–500° C. in low temperature. A metal organic chemical vapor deposition (MOCVD) oxide film may be used as the first insulating layer 43.

Figure 5C:
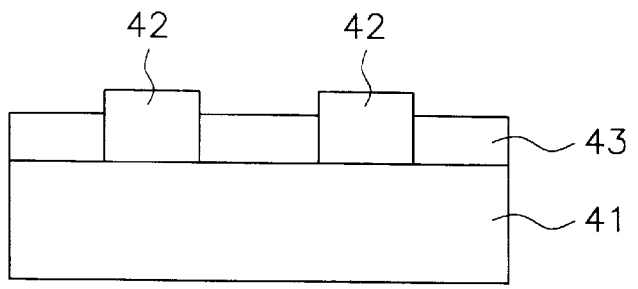

Referring to FIG. 5C, the first insulating layer is etched by a wet or dry etching process so that a height of the first insulating layer 43 is lower than that of the first metal interconnection 43. The first insulating layer may be dry-etched without a photosensitive film or with a photosensitive film. So as to improve the etching selectivity in dry-etching the first insulating layer 43, the freon gas such as CHF3, CF4, C2F6 may be used or the freon gas with the diluted gas of CO, O2, AR, He may be used.

Figure 5D:
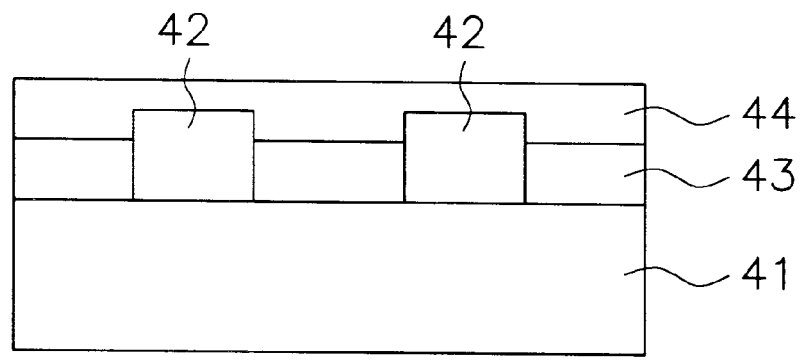
Figure 5E:
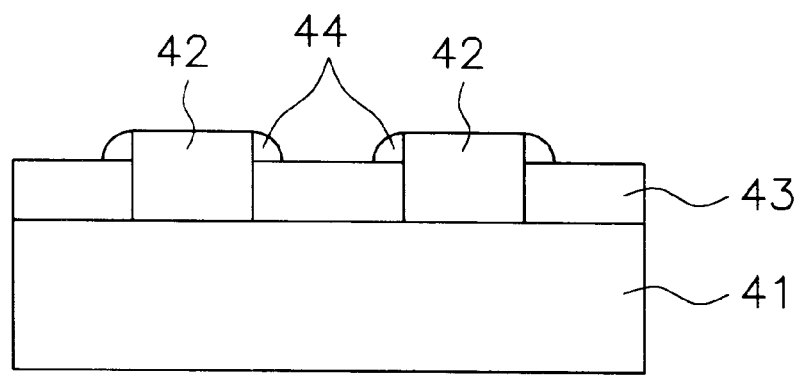

A metal film for spacers 44 is deposited over the substrate as shown in FIG. 5D and a metal film 44 is etched by a dry etching process using the etching selectivity between the metal film 44 and the first insulating layer 43 to form metal spacers 44a in the sidewalls of the first metal interconnection over the first insulating layer 43 as shown in FIG. 5E.

Figure 5F:
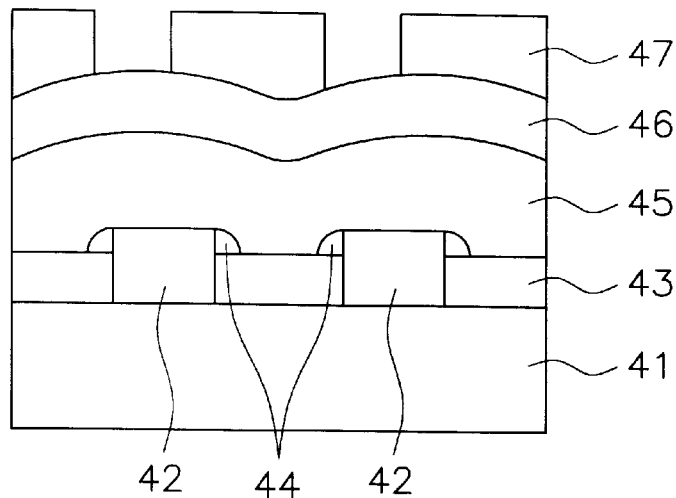
Figure 5G:
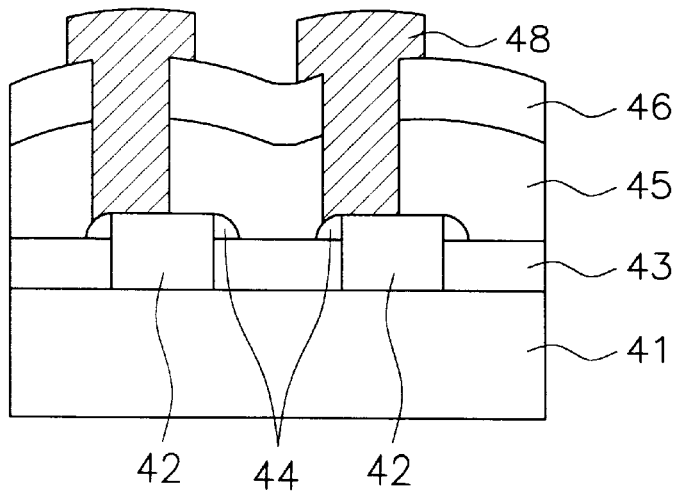

As shown in FIG. 5F, a second insulating layer for planarization 45 having good planarization property is formed over the substrate and a third insulating layer 46 is formed on the second insulating layer, thereby planarizing the surface of the substrate. As shown in FIG. 5G, a photosensitive film 47 is formed on the third insulating layer 46 and then the second and third insulating layers 45 and 46 to form a contact hole and a second metal interconnection 48 is formed over the third insulating layer through the contact hole.

According to another embodiment of this invention, the first insulating layer is etched to have a step difference from the first metal interconnection 42 so that the following planarization process is carried out with ease and occurrence of void is prevented. Besides, the metal spacers are formed in sidewalls of the first metal interconnection so that the mutual contact between the first and second metal interconnections through the metal spacers is accomplished, although the misalignment between the first and second metal interconnections is occurred in forming the contact hole. Therefore, the process margin is sufficiently assured in forming the photosensitive film for contact hole.

As above described, the method for forming a multi-level metal interconnection forms a second metal interconnection following metal spacers to assure the sufficient overlap margin between first and second metal interconnections and then to improve interconnection property of the device, thereby improve the yield and fabricating the high degree device with ease. Besides, the planarization process is carried out with ease, following the formation of the metal spacers, thereby preventing void from generating and improving the yield.

While the invention has been particularly shown and described with respect to preferred embodiment thereof, it will be understood by those skilled in the art that various changes in form and details may be made therein without departing from the spirit and the scope of the invention as defined by the following claims.

What is claimed is:

1. A method for forming a multi-level metal interconnection, comprising the steps of:
    forming a first metal interconnection over an underlying layer;
    forming an insulating layer having a selected thickness over the underlying layer including the first metal interconnection;
    etching the insulating layer to form a contact hole, thereby exposing the first metal interconnection;
    forming a metal plug in the contact hole to contact with the first metal interconnection;
    etching the insulating layer by a portion of the selected thickness;
    forming a pair of metal spacers in sidewalls of the metal plug over the insulating layer; and
    forming a second metal interconnection over the insulating layer to contact with the first metal interconnection through one of the metal spacers.

2. The method as claimed in claim 1, wherein the metal plug is comprised of tungsten.

3. The method as claimed in claim 2, wherein the metal plug formation step includes the step of forming a tungsten film over the insulating layer including the contact hole and the step of carrying out a chemical mechanical polishing process to form the metal plug.

4. The method as claimed in claim 1, wherein the insulating layer is etched by using an oxide target so that a height of the insulating layer is lowered than that of the metal plug.

5. The method as claimed in claim 1, wherein further comprising the step of removing another metal spacer which is not contacted with the second metal interconnection, following the formation step of the second metal interconnection.

6. A method for forming a multi-level metal interconnection, comprising the steps of:
    forming a first metal interconnection over an underlying layer;
    forming a first insulating layer having a selected thickness over the underlying layer including the first metal interconnection;
    etching the first insulating layer to a portion of the selected thickness so that a height of the first insulating layer is lower than that of the first metal interconnection;
    forming metal spacers in sidewalls of the first metal interconnection over the first insulating layer;
    forming a planarization layer over the first insulating layer including the metal spacers and the first metal interconnection;
    etching the first insulating layer and the planarization layer to form a contact hole, thereby exposing the first metal interconnection; and
    forming a second metal interconnection to contact with the metal interconnection through the contact hole.

7. The method as claimed in claim 6, wherein the first insulating layer is etched by a wet etching process.

8. The method as claimed in claim 6, wherein the first insulating layer is etched by a dry etching process.

9. The method as claimed in claim 8, wherein the first insulating layer is etched by using only a freon gas or a freon gas with a diluted gas of CO, O2, AR or He to improve an etching selectivity between the first insulating layer and the first metal interconnection.

10. The method as claimed in claim 6, wherein the first insulating layer is comprised of a low temperature PECVD oxide film.

11. The method as claimed in claim 10, wherein the first insulating layer is comprised of a Si-rich oxide film.

12. The method as claimed in claim 6, wherein the first insulating layer is comprised of a MOCVD oxide film.

13. The method as claimed in claim 6, wherein the planarization layer formation step includes the step of forming a second insulating layer having good planarization property over the first insulating layer including metal spacers and the first metal interconnection; and forming a third insulating layer over the second insulating layer.

* * * * *